United States Patent [19]

Onodera et al.

[11] Patent Number: 5,334,930
[45] Date of Patent: Aug. 2, 1994

[54] PEAK DETECTION CIRCUIT

[75] Inventors: Akira Onodera, Kawagoe; Koichi Yamazaki, Sakado, both of Japan

[73] Assignee: Nippon Conlux Co., Ltd., Tokyo, Japan

[21] Appl. No.: 882,476

[22] Filed: May 13, 1992

[30] Foreign Application Priority Data

May 14, 1991 [JP] Japan .................. 3-109368

[51] Int. Cl.$^5$ .................. G01R 19/04; H03K 5/19
[52] U.S. Cl. .................. 324/103 P; 307/351; 328/151
[58] Field of Search .............. 324/103 P, 158 R, 73.1; 307/351, 352; 328/162, 150, 151

[56] References Cited

U.S. PATENT DOCUMENTS

| | | | |
|---|---|---|---|
| 3,668,532 | 6/1972 | Potush | 328/151 |
| 3,767,938 | 10/1973 | Kueper | 328/151 |
| 3,973,197 | 8/1976 | Meyer | 324/103 P |
| 4,024,459 | 5/1977 | Mears | 324/103 P |
| 4,045,743 | 8/1977 | Walker | |
| 4,166,245 | 8/1979 | Roberts | 324/103 P |
| 4,399,414 | 8/1983 | Bird | 328/151 |
| 4,495,529 | 1/1985 | Gustafson | 360/46 |
| 4,639,618 | 1/1987 | Olesen | 324/103 P |

FOREIGN PATENT DOCUMENTS

| | | |
|---|---|---|
| 2135320 | 1/1973 | Fed. Rep. of Germany . |
| 3325411A1 | 2/1984 | Fed. Rep. of Germany . |
| 2537803 | 12/1982 | France . |
| 62-277561 | 12/1987 | Japan . |
| 2176360A | 12/1985 | United Kingdom . |

*Primary Examiner*—Vinh Nguyen
*Attorney, Agent, or Firm*—Spensley Horn Jubas & Lubitz

[57] ABSTRACT

A peak detection circuit accurately detects peaks even if a noise component is included in the input signal. The peak detection circuit includes: a differentiating circuit which produces a differentiated signal of an input signal, a peak hold circuit which produces a peak value envelope of an output of said differentiating circuit, and a first comparator which compares an output of said differentiating circuit and a reference signal formed on the basis of an output of said peak hold circuit, and which detects when said input signal falls below said reference signal A second comparator detects a portion which exceeds an output of said differentiating circuit A flip-flop produces a signal which rises in accordance with an output of said second comparator and falls in accordance with an output of said first comparator, thereby to form a signal representing a peak by the rise of an output of said flip-flop.

1 Claim, 3 Drawing Sheets

PEAK DETECTION CIRCUIT

DETAILED DESCRIPTION OF THE INVENTION

The present invention relates to a circuit that detects a peak position in an input signal, and outputs a signal which represents that peak position.

Conventionally, the detection of signal peaks has been performed using differentiation processing of input signals by a differentiating circuit configured from resistors and capacitors, and then detecting the zero-cross point of signals which have undergone differentiation processing and making this the peak position.

A differentiating circuit comprising resistors and capacitors detects all changes in the waveform of the input signal. There is the tendency for the input waveform to change greatly due to media characteristics, dust or damage, or to the strength of the power when there is write in the case of an optical recording medium such as an optical card or an optical disk. Not only this, zero-cross circuits have zero-cross detection for the differentiated waveform itself and therefore mistakenly detect noise components in portions where the signal level is low, then generate signals for a peak at positions where there are not peaks.

SUMMARY OF THE INVENTION

In the light of this, the present invention has as an object the provision of a peak detection circuit which can accurately detect peaks even if a noise component is included in the input signal.

In order to achieve this objective, the present invention provides a peak detection circuit, comprising: a differentiating circuit which produces a differentiated signal of an input signal, a peak hold circuit which produces a peak value envelope of an output of said differentiating circuit, a first comparator which compares an output of said differentiating circuit and a reference signal which has a value corresponding to that of an output of said peak hold circuit, and detects when said input signal falls below said reference signal, a second comparator which detects a portion which exceeds an output of said differentiating circuit, and a flip-flop for producing a signal which rises in accordance with an output of said second comparator and falls in accordance with an output of said first comparator, thereby to form a signal representing a peak by the rise of an output of said flip-flop.

The present invention forms a signal which is a differentiated signal from an input signal. In the output of this differentiating circuit is included noise as well as the original peak in the input signal. The peak hold circuit produces the peak value envelope of one polarity of the output of the differentiating circuit, and applies it to a first comparator. This first comparator compares the peak value envelope with the output of the differentiating circuit and generates a low level output when the differentiated output falls below the peak value envelope, and applies it to a flip-flop. This resets the flip-flop. Then, the output of the differentiating circuit is applied to the second comparator and the point where the zero-cross point exceeds the other polarity is detected, and the rise of that detection output performs setting of the flip-flop. The set flip-flop is not reset for as long as the differentiated output does not drop below the peak value envelope. Therefore, once the flip-flop has been set, there is no resetting due to noise until the differentiated output drops below the peak value envelope.

As has been described above, unlike when setting and resetting is performed for all of the differentiated output of input signals as in a conventional peak detection circuit, the differentiated signals are reset only when the differentiated signals fall below the peak value envelope of the differentiated signals and so it is possible to provide a circuit that does not mistakenly detect peaks due to noise that occurs prior to resetting. Then, resetting is rendered using the peak value envelope as a reference so that the level of the reference varies corresponding to changes in the signal level changes so as to be possible to prevent the circuit operation for the detection of the peak position, from being influenced due to changes in the signal level.

PREFERRED EMBODIMENT

Figure 1:
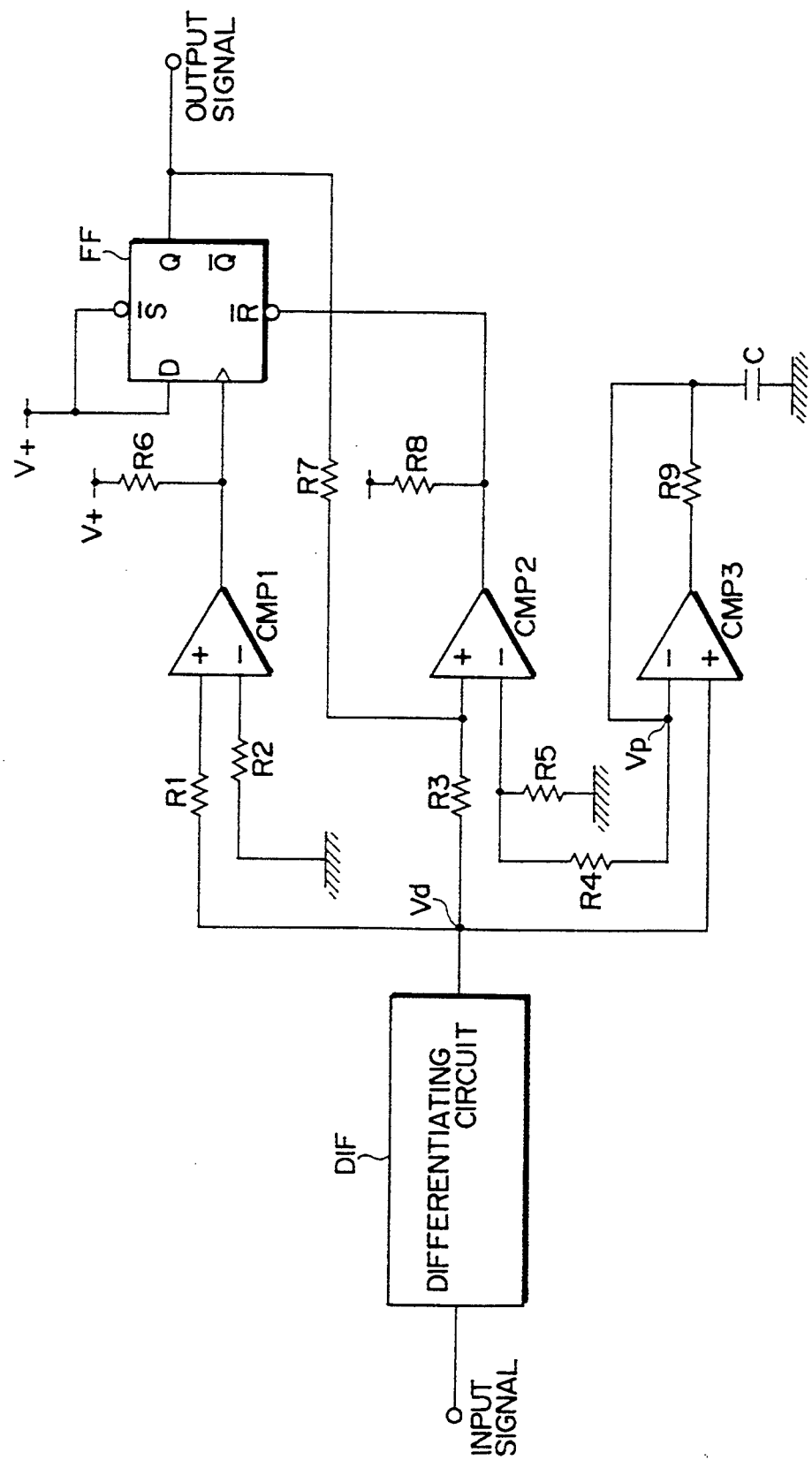
FIG. 1 shows a circuit of a first embodiment of the present invention.

FIG. 1 shows a circuit of a first embodiment of the present invention. In this figure, the differentiating circuit DIF forms the signal Vd which is the differentiated signal of the input signal, and applies it to each of the non-inverted input terminals + of the comparator CMP1, comparator CMP2 and comparator CMP3. The comparator CMP1 is a zero-cross comparator, and receives the differentiated signals Vd via the resistor R1, and has the inverted input terminal earthed via the resistor R2, and the output terminal connected to the power supply V+ via the resistor R6. Then, at the point where the differentiated signal Vd falls from the negative value to become zero, and the value changes from the correct rise value to become zero, the zero-cross comparator creates a falling rectangular wave output signal and applies the output signal to clock input terminal of the flip-flop FF.

The comparator CMP2 creates a negative output signal when the differentiated signal Vd which is applied to the non-inverted input terminal via the resistor R3, is smaller than the reference signal applied to the inverted input terminal—via the splitter circuit by the resistors R4 and R5, and creates a zero output signal for other times, and applies the zero output signal to the reset terminal R bar of the flip-flop FF from the output terminal which is connected to the power supply V+ by the resistor R8, and so that the reference signal is applied from the comparator CMP3.

The comparator CMP3 configures a peak hold circuit, and the differentiated signal Vd is applied to the non-inverted input terminal thereof, and the peak-held output signal is applied from its output terminal to the integrating circuit. The integrating circuit comprises a resistor R9 and a capacitor C, and is connected to the inverted input terminal—of the comparator CMP3, and on the basis of the peak hold output, forms the peak value envelope and applies it as the reference value to the inverted input terminal—of the comparator CMP2 via the splitter circuit comprising resistors R4 and R5.

The flip-flop FF is reset when a falling pulse is applied from the comparator CMP2 to the reset terminal R bar and an output of the output terminal Q is falling, and is reset when a rise pulse is applied from the output terminal of the comparator CMP1 and is applied to the clock input terminal, and creates an output at the output terminal Q. The output terminal Q of the flip-flop FF is connected to the non-inverted input terminal + via the resistor R7 which has a resistance sufficiently larger than that of the resistor R3, and the inversion operation of the flip-flop FF has a hysteresis characteristic.

Figure 2:
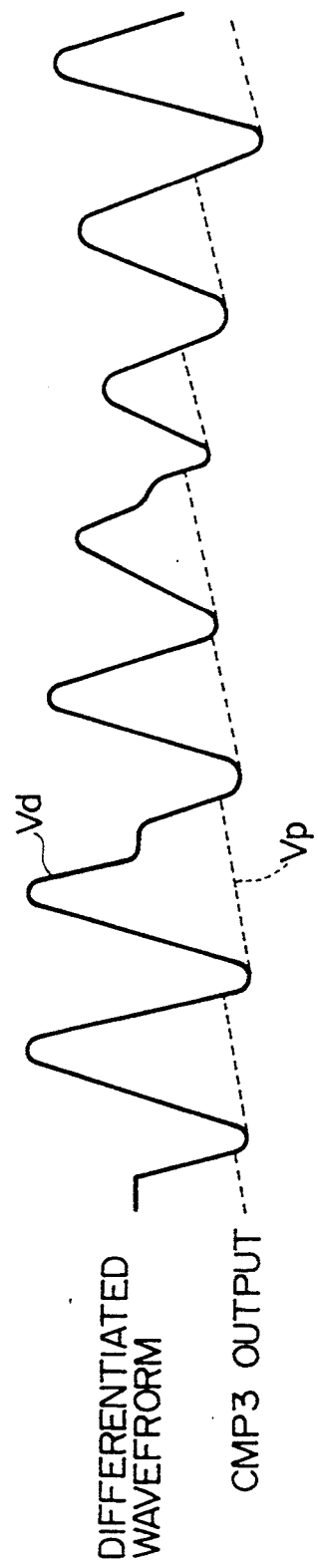
FIG. 2 shows the peak value envelope which is the output signal of the comparator CMP3 in the first embodiment.

FIG. 2 shows the differentiated signal Vd and the waveform of the peak value envelope $V_p$. The differentiated signal Vd is a phase-shifted input signal which is substantially sine wave, and the peak value enveloped Vp has a waveform connecting the peaks on the negative side.

Figure 3:
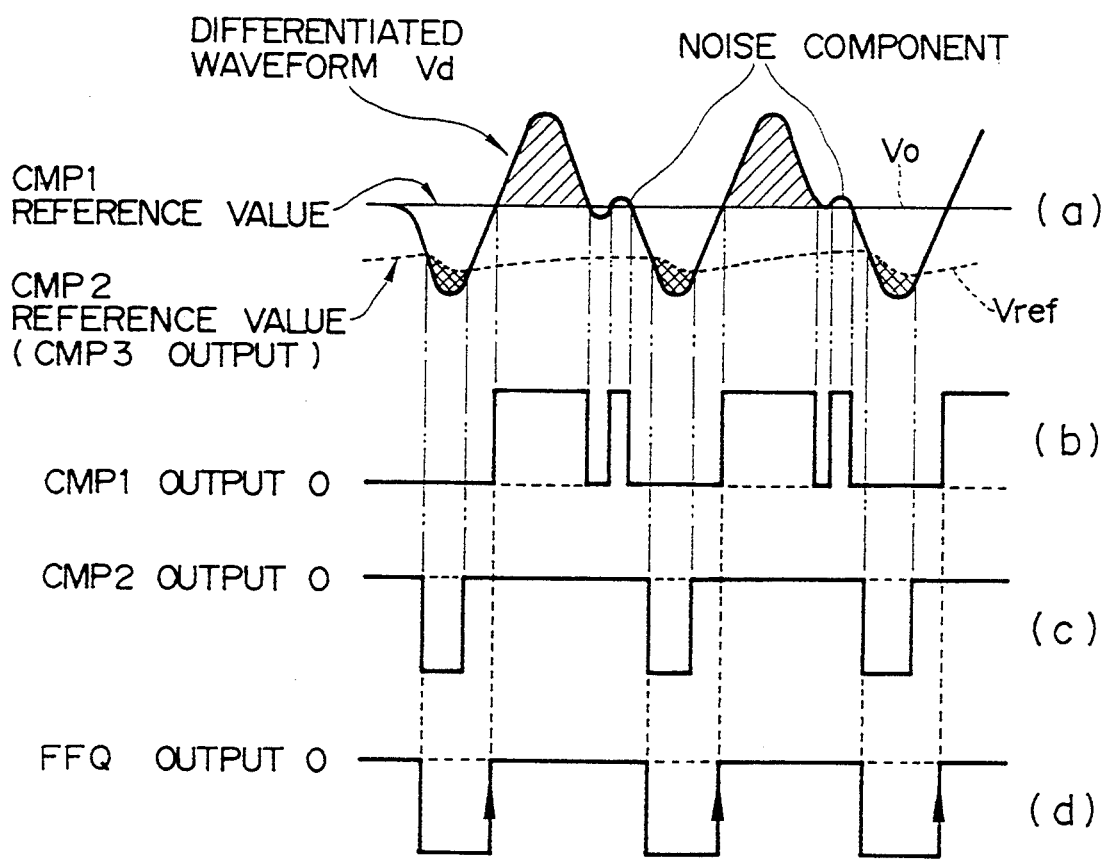
FIG. 3 shows the signal waveform for each portion of the circuit.

FIG. 3 shows the signal waveform for each portion of the circuit. (a) of FIG. 3 shows the differentiated signal Vd, the comparator CMP1 reference value Vo and the comparator CMP2 reference signal, that is, the reference signal Vref formed by splitting the peak value envelope Vp, and performs circuit operation on the basis of both of these signals. More specifically, there is the generation of an output of the comparator CMP1 when the differentiated signal Vd is larger than the reference value Vo and so the output signal of the comparator CMP1 is a positive rectangular wave signal when the differentiated signal Vd is greater than the reference value Vo. Accordingly, the output signal of the comparator CMP1 becomes a rectangular wave signal corresponding to the positive portion in the differentiated signal Vd which includes the noise component, and corresponds to the portion shown by the hatching in (a) of FIG. 3. In contrast, the output signal of the comparator CMP2 is a signal that becomes negative when it falls below the reference signal Vref shown by the broken line, and corresponds to the portion shown by the cross-hatching in (a) of FIG. 3.

The flip-flop FF outputs from the output terminal Q a fall signal from zero to negative, when there is a rise in the output signal of the comparator CMP2, and outputs from the output terminal Q a rise signal from zero to positive, when there is a rise from zero to positive of the output signal of the comparator CMP1. The zero-cross point where the output signal of the comparator CMP1 rises from zero to positive is the original differentiated signal Vd but is also due to noise. In order to exclude the portion due to this noise, there is resetting of the flip-flop FF by the output signal of the comparator CMP2. The creation of the output signals of the comparator CMP2 is at the point where there is negative polarity extremely close to the peak value of the input signal and so noise of a considerable degree is in with the output signals embedded in the negative polarity portion of the differentiated signal Vd.

In addition, the output terminal Q of the flip-flop FF is connected to the non-inverted input terminal of the comparator CMP2 via the resistor R7 which has a resistance value which is comparatively large when compared to the resistor R3 and so has a hysteresis characteristic in inversion operation, and can remove even small noise.

The flip-flop FF repeats inversion operation when the differentiated signal Vd is applied for the differentiating circuit for each input signal, and shows the peak value of the input signals by the rise point (shown by the arrow in FIG. 3) in the output signal of the output terminal Q of the flip-flop FF in accordance with this inversion operation. Accordingly, it is possible to know the peaks of the input signals by the rise points.

What is claimed is:

1. A peak detection circuit, comprising:
   a differentiating circuit which produces a differentiated signal of an input signal,
   a peak hold circuit which produces a peak value envelope of an output of said differentiating circuit,
   a voltage dividing circuit for dividing an output of said differentiating circuit so as to produce a reference signal,
   a first comparator which receives the output of said differentiating circuit and the reference signal which has a value corresponding to that of an output of said peak hold circuit to compare them with each other, and detects when said input signal falls below said reference signal so as to produce an output representing such a condition,
   a second comparator which detects a portion by which the output of said differentiating circuit exceeds the zero-cross point so as to produce a clock pulse, and
   a flip-flop for producing a signal which rises in accordance with the clock pulse from said second comparator and falls in accordance with the output of said first comparator, the output terminal of said flip-flop being connected to an input terminal of said first comparator via a resistor having a high resistance to attain a hysteresis characteristic in inversion operation of said flip-flop,
   thereby to form an output signal representing a peak of the input signal by the rise of the output of said flip-flop.

* * * * *